US008623697B2

United States Patent
Magistretti et al.

(10) Patent No.: US 8,623,697 B2
(45) Date of Patent: Jan. 7, 2014

(54) AVOIDING DEGRADATION OF CHALCOGENIDE MATERIAL DURING DEFINITION OF MULTILAYER STACK STRUCTURE

(75) Inventors: Michele Magistretti, Milan (IT); Pietro Petruzza, Milan (IT); Samuele Sciarrillo, Milan (IT); Cristina Casellato, Milan (IT)

(73) Assignee: Micron Technology, Inc., Boise, ID (US)

(*) Notice: Subject to any disclaimer, the term of this patent is extended or adjusted under 35 U.S.C. 154(b) by 49 days.

(21) Appl. No.: 13/132,311

(22) PCT Filed: Dec. 31, 2008

(86) PCT No.: PCT/IT2008/000827
§ 371 (c)(1),
(2), (4) Date: Sep. 21, 2011

(87) PCT Pub. No.: WO2010/076837
PCT Pub. Date: Jul. 8, 2010

(65) Prior Publication Data
US 2012/0001145 A1    Jan. 5, 2012

(51) Int. Cl.
*H01L 29/02* (2006.01)
(52) U.S. Cl.
USPC ............ 438/102; 438/103; 438/104; 257/2; 257/3; 257/4; 257/5; 257/E29.002
(58) Field of Classification Search
USPC ................ 257/2–5, 229.002, E29.002; 438/102–104
See application file for complete search history.

(56) References Cited

U.S. PATENT DOCUMENTS

| | | | |
|---|---|---|---|
| 2005/0263829 A1* | 12/2005 | Song et al. | 257/379 |
| 2007/0045606 A1* | 3/2007 | Magistretti et al. | 257/4 |
| 2007/0096073 A1* | 5/2007 | Dennison et al. | 257/3 |
| 2007/0246782 A1* | 10/2007 | Philipp et al. | 257/379 |
| 2008/0179591 A1* | 7/2008 | Breitwisch et al. | 257/42 |

OTHER PUBLICATIONS

Refractory metals http://metals.about.com/od/properties/a/Refractory-Metals.htm.*
Nitride. (1992). In Academic Press Dictionary of Science and Technology. Retrieved from http://www.credoreference.com/entry/apdst/nitride.*
"Ternary" Merriam-Webster Online Dictionary. 2007, http://www.merriam-webster.com (Sep. 13, 2007).*
Metal. (1992). In Academic Press Dictionary of Science and Technology. Retrieved from http://www.credoreference.com/entry/apdst/meta.*

* cited by examiner

*Primary Examiner* — Jami M Valentine
(74) *Attorney, Agent, or Firm* — Schwegman Lundberg & Woessner, P.A.

(57) ABSTRACT

A storage element structure for phase change memory (PCM) cell and a method for forming such a structure are disclosed. The method of forming a storage element structure, comprises providing a multilayer stack comprising a chalcogenide layer (206), a metal cap layer (208), and a dielectric hard mask layer (210), depositing and patterning a photo resist layer (212) on top of the multilayer stack, etching the dielectric hard mask layer using the photo resist layer as etch mask, after the dielectric hard mask layer is etched, removing the photo resist layer before etching the chalcogenide, etching the chalcogenide layer using the dielectric hard mask layer as etch mask, depositing a spacer dielectric (214) over the multilayer stack and anisotropically etching the spacer dielectric to form sidewall spacers (216) for the multilayer stack.

16 Claims, 8 Drawing Sheets

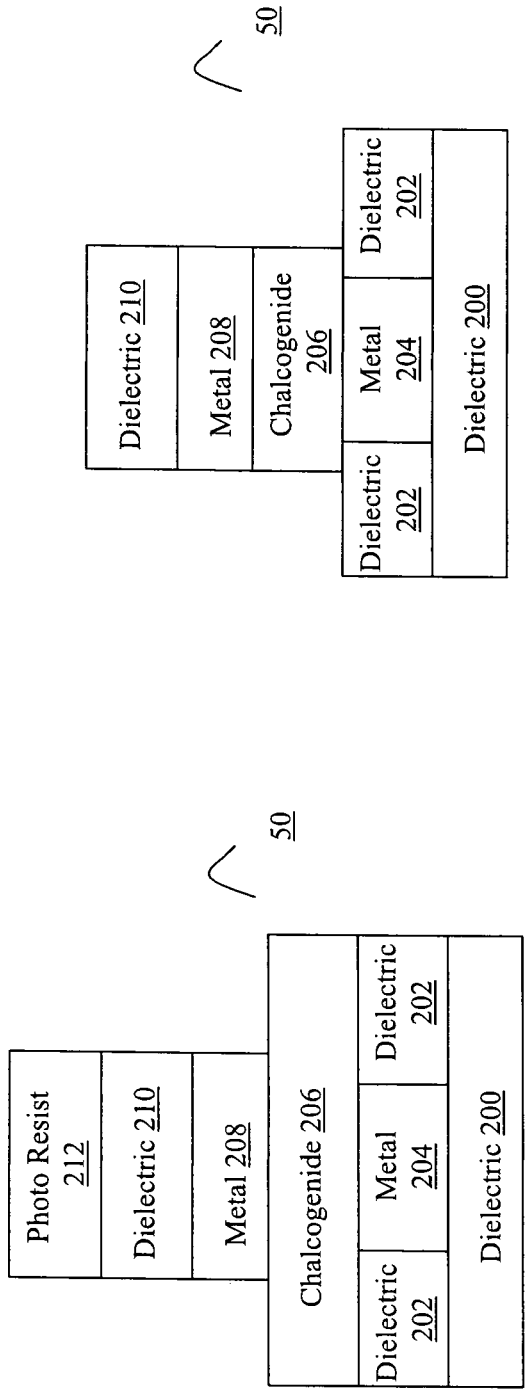

AVOIDING DEGRADATION OF CHALCOGENIDE MATERIAL DURING DEFINITION OF MULTILAYER STACK STRUCTURE

CROSS REFERENCE TO RELATED APPLICATION

This patent application is a U.S. National Phase application under 35 U.S.C. §371 of International Application No. PCT/IT2008/000827, filed on Dec. 31, 2008, entitled AVOIDING DEGRADATION OF CHALCOGENIDE MATERIAL DURING DEFINITION OF MULTILAYER STACK STRUCTURE.

BACKGROUND OF THE INVENTION

1. Field of the Invention

The present invention relates to Phase Change Memory (PCM) cells and a fabrication method thereof.

2. Description of the Related Art

Embedded SRAM (Static Random Access Memory) and DRAM (Dynamic Random Access Memory) have problems with non-volatility and soft error rates, while embedded flash memories require additional masking layers/processing steps during manufacture, require high-voltage for programming, and have issues with endurance and reliability. PCM overcomes the criticality of the above mentioned parameters and exhibits favorable write speeds, small cell sizes, simpler circuitries and a fabrication compatibility with the Complementary Metal-Oxide-Semiconductor (CMOS) process. However, additional improvements are needed in the evolution of the PCM technology.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 7 illustrates a cross-sectional view of the multilayer stack, showing etching a hard mask dielectric and a metal cap of chalcogenide using the photo resist as etch mask in accordance with one embodiment of the present invention.

FIG. 8 illustrates a cross-sectional view of the multilayer stack, showing that chalcogenide is patterned after the photo resist has been removed in accordance with one embodiment of the present invention.

Figure 1:
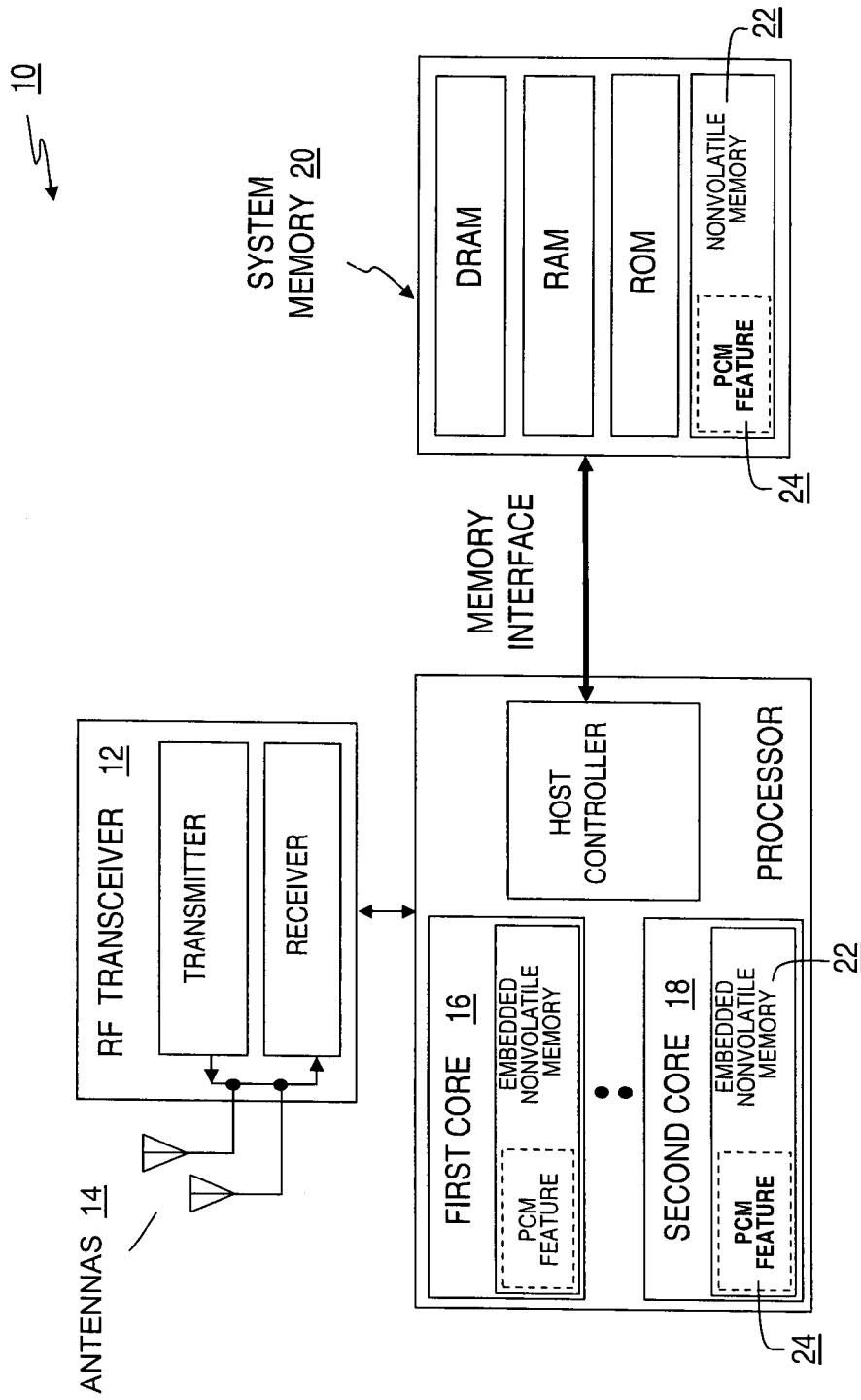
FIG. 1 illustrates a wireless architecture that incorporates PCM in accordance with one embodiment of the present invention.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals may be repeated among the drawings to indicate corresponding or analogous elements.

DETAILED DESCRIPTION OF THE ILLUSTRATED EMBODIMENT

In the following detailed description, an integration scheme is disclosed for the fabrication of PCM cells in microelectronic devices. Reference is made to the accompanying drawings within which are shown, by way of illustration, specific embodiments by which the present invention may be practiced. It is to be understood that other embodiments may exist and that other changes may be made without departing from the scope and spirit of the present invention.

In addition, specific details such as specific materials are set forth herein in order to provide a thorough understanding of the present invention. However, it will be apparent to one skilled in the art that the present invention may be practiced without these specific details. In other instances, well known processing steps and/or microelectronic device elements have not been described in detail in order not to unnecessarily obscure the present invention. For example, well-known cleaning steps, protective layers, and/or interconnecting circuitry often used in the fabrication of microelectronic devices, are not described.

The terms on, above, below, and adjacent as used herein refer to the position of one layer or element relative to other layers or elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g. as in a cause an effect relationship).

FIG. 1 illustrates a wireless architecture embodiment with communications device 10. The communications device 10 has nonvolatile memory capabilities. As shown in this wireless embodiment, communications device 10 includes one or more antenna structures 14 to allow radios to communicate with other over-the-air communication devices. As such, communications device 10 may operate as a cellular device or a device that operates in wireless networks such as, for example, Wireless Fidelity (Wi-Fi) that provides the underlying technology of Wireless Local Area Network (WLAN) based on the IEEE 802.11 specifications, WiMax and Mobile WiMax based on IEEE 802.16-2005, Wideband Code Division Multiple Access (WCDMA), and Global System for Mobile Communications (GSM) networks, although the present invention is not limited to operate in only these networks. The radio subsystems collocated in the same platform of communications device 10 provide the capability of communicating with different frequency bands in an RF/location space with other devices in a network. It should be understood that the scope of the present invention is not limited by the types of, the number of, or the frequency of the communication protocols that may be used by communications device 10. It should be further noted that the present invention is not limited to wireless communication embodiments and other, non-wireless applications may use the present invention.

The embodiment illustrates the coupling of antenna structure 14 to a transceiver 12 to accommodate modulation/demodulation. In general, analog front end transceiver 12 may be a stand-alone Radio Frequency (RF) discrete or integrated analog circuit, or transceiver 12 may be embedded with a processor having one or more processor cores 16 and 18. The multiple cores allow processing workloads to be shared across the cores and handle baseband functions and application functions. An interface may be used to provide communication or information between the processor and the memory storage in a system memory 20. Although the scope of the present invention is not limited in this respect, the interface may comprise serial and/or parallel buses to share information along with control signal lines to be used to provide handshaking between the processor and system memory 20.

The system memory 20 may optionally be used to store instructions that are executed by the processor during the operation of wireless communication device 10, and may be used to store user data such as the conditions for when a message is to be transmitted by wireless communication device 10 or the actual data to be transmitted. For example, the instructions stored in system memory 20 may be used to perform wireless communications, provide security functionality for communication device 10, user functionality such as calendaring, email, internet browsing, etc.

System memory 20 may be provided by one or more different types of memory and may include both volatile and a nonvolatile memory 22 having a phase change material feature 24 made in according with the method illustrated in FIGS. 5-11. Nonvolatile memory 22 may be referred to as a Phase Change Memory (PCM), Phase-Change Random Access Memory (PRAM or PCRAM), Ovonic Unified Memory (OUM) or Chalcogenide Random Access Memory (C-RAM).

The volatile and nonvolatile memories may be combined in a stacking process to reduce the footprint on a board, packaged separately, or placed in a multi-chip package with the memory component placed on top of the processor. The embodiment also illustrates that one or more of the processor cores may be embedded with nonvolatile memory 22. The nonvolatile memory 22 may have a phase change material feature 24 made in according with the method illustrated in FIGS. 5-11.

Figure 2:
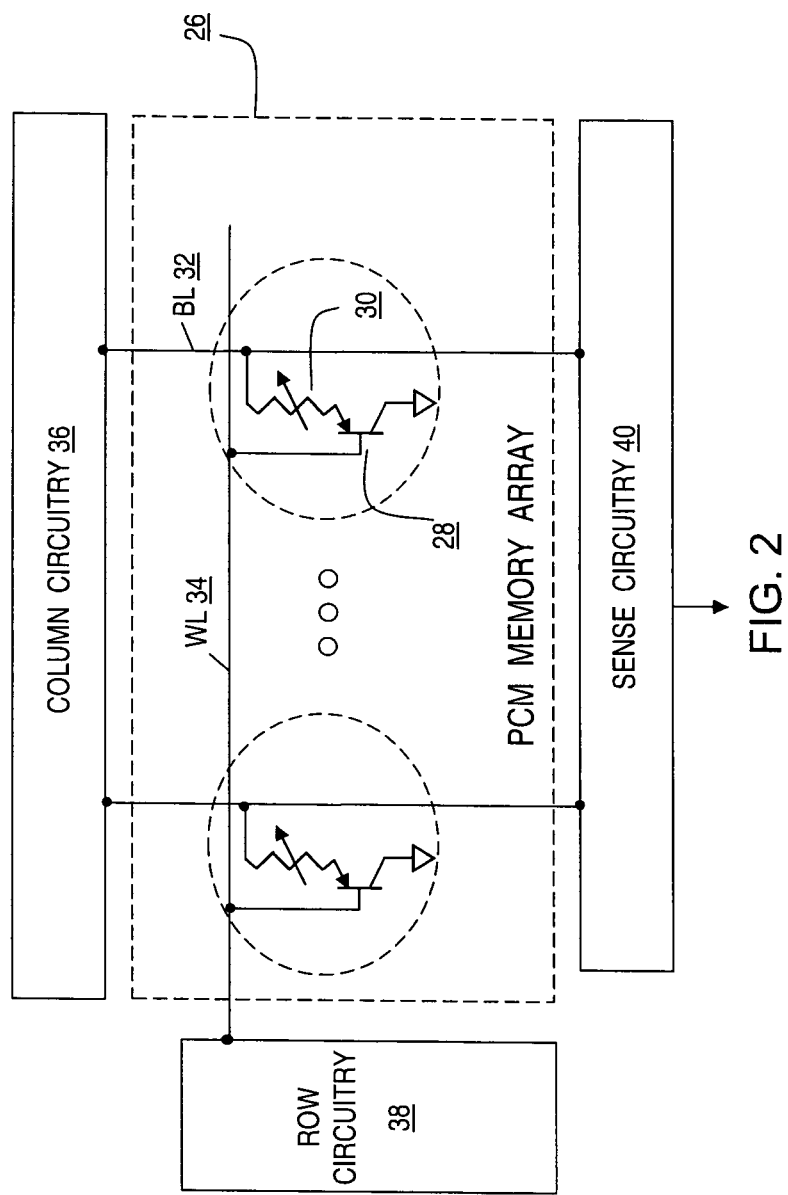
FIG. 2 illustrates a PCM array of memory cells that include a storage material and a selector device in accordance with one embodiment of the present invention.

Illustrated in FIG. 2 is an array of PCM cells 26 in system memory 20 and/or the nonvolatile memory in processor cores 16 and 18 in FIG. 1. The PCM cells are connected to a row circuitry 38 and a column circuitry 36 which function to select the cells. They are also connected to a sense circuitry 40 which reads the states of the cells. PCM cells are made of alloys of elements of group VI of the periodic table—elements such as Te or Se that are referred to as chalcogenides or chalcogenic materials. Chalcogenides may be used advantageously in phase change memory cells to provide data retention and remain stable even after the power is removed from the nonvolatile memory. Taking the phase change material as $Ge_2Sb_2Te_5$ for example, two phases or more are exhibited having distinct electrical characteristics useful for memory storage.

Figure 3:
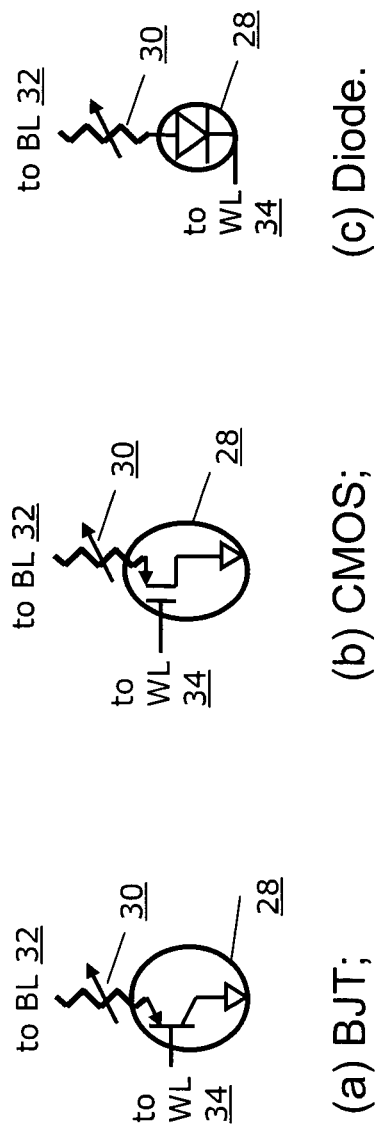
FIG. 3 illustrates three possible selector devices for controlling the chalcogenide memory element in accordance with one embodiment of the present invention.

Array 26 includes memory cells each having a selector device 28 and a memory element 30. Although the array is illustrated with bipolar junction transistors (BJT) as selector devices, it should be noted that alternative embodiments may use CMOS selector devices or diodes, as shown in FIG. 3, to identify and selectively change the electrical properties (e.g. resistance, capacitance, etc.) of the chalcogenide material through the application of energy such as, for example, heat, light, voltage potential, or electrical current. The chalcogenic material may be electrically switched between different states intermediate between the amorphous and the crystalline states, thereby giving rise to a multilevel storing capability.

To alter the state or phase of the memory material, this embodiment illustrates a programming voltage potential that is greater than the threshold voltage of the memory select device that may be applied to the memory cell. An electrical current flows through the memory material and generates heat that changes the electrical characteristic and alters the memory state or phase of the memory material. By way of example, heating the phase-change material to a temperature above 900° C. in a write operation places the phase change material above its melting temperature ($T_M$). Then, a rapid cooling places the phase-change material in the amorphous state that is referred to as a reset state where stored data may have a "1" value. Taking $Ge_2Sb_2Te_5$ as an example, the time between achieving the melting temperature Tm and quenching after the local heating to achieve the amorphous phase may be less than 50 nanoseconds.

On the other hand, to program a memory cell from reset to set, the local temperature is raised higher than the crystallization temperature (Tx) for a time longer than 50 ns (for $Ge_2Sb_2Te_5$) to allow crystallization to complete. The phase-change material in the crystalline form is referred to as a set state and stored data may have a "0" value. Thus, the cell can be programmed by setting the amplitude and pulse width of the current that will be allowed through the cell. In summary, a higher magnitude, fast pulse will amorphize the cell, whereas a moderate magnitude, longer pulse will allow the cell to crystallize.

In a read operation, the bit line (BL) 32 and word line (WL) 34 are selected and an external current is provided to the selected memory cell. To read a chalcogenide memory device, the current difference resulting from the different device resistance is sensed. It is then determined whether data stored in the selected memory cell is a "1" or "0" based on a voltage change caused by a resistance of the phase-change material of the selected memory cell. It is to be appreciated that the association of reset and set with amorphous and crystalline states, respectively, is a convention and that at least an opposite convention may be adopted.

Figure 4:
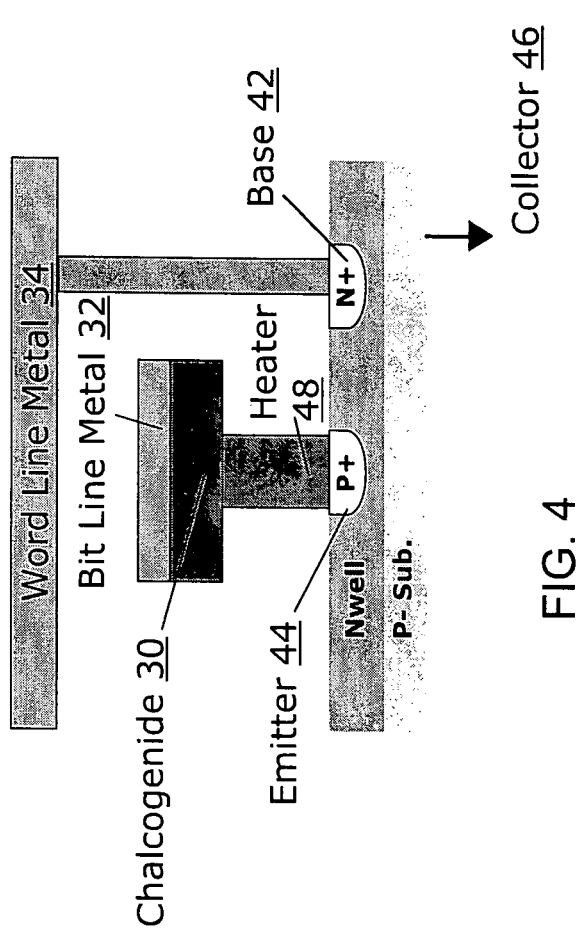
FIG. 4 illustrates a cross-sectional view of a PCM cell structure in accordance with one embodiment of the present invention.

FIG. 4 illustrates a simplified cross-sectional view of the PCM cell, whose function is discussed above. The chalcogenide memory element 30 is coupled with a bit line metal 32 on its top and with a heater 48 at its bottom. The heater 48 is connected to the emitter 44 of a BJT. The base 42 of the BJT is connected to word line metal 34. The collector 46 of the BJT is connected to the substrate.

Figure 5:
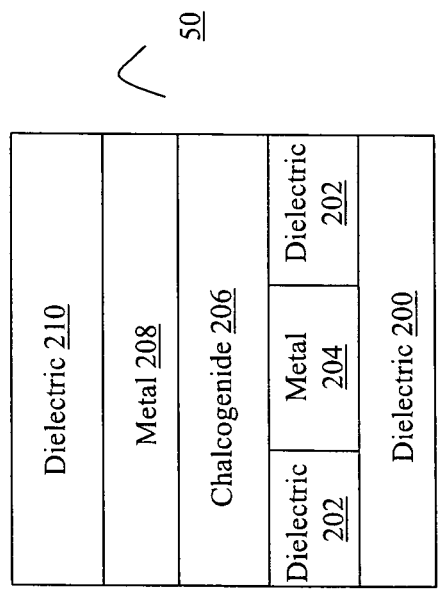
FIG. 5 illustrates a cross-sectional view of a starting multilayer stack to be defined for a PCM cell structure in accordance with one embodiment of the present invention.

The present invention describes a method for fabricating such a PCM cell structure, starting from a multilayer stack 50 of materials as illustrated in FIG. 5. In particular, it presents a method for avoiding degradation of chalcogenide material during the definition process of the multilayer stack.

In standard approach, the definition of a multilayer stack with chalcogenide using a dielectric hard mask is done with a self aligned etch, after which photo resist and polymers are removed by dry and wet processes, respectively. The dry and wet chemistries interact with chalcogenide sidewalls, causing material degradation such as oxidation, which may result in electrical issues for the devices.

The present invention presents an alternative process flow for PCM cells definition which prevents chalcogenide degradation during photo resist and polymers removal after its definition. The solution employed in the present invention is photo resist stripping after hard mask etching and before chalcogenide definition. As a result, the chalcogenide sidewalls will not be exposed to dry and wet chemicals used to remove photo resist and polymers. Further, the present invention forms dielectric spacers on chalcogenide sidewalls, protecting the chalcogenide from degradation during multilayer stack etch and the eventual cleanings after etch for removing etch sub-products.

Turning to FIG. 5, it illustrates the cross-sectional view of a multilayer stack 50 of different materials that is provided for fabricating a PCM cell structure in accordance with one embodiment of the present invention. At the bottom of the stack 50 is a metal heater material 204 of the PCM cell which surrounded by a first dielectric material 202 on the sides and a second dielectric material 200 at the bottom. The heater material 204 corresponds to the heater in FIG. 4. The sum of the metal heater material 204 and the adjacent dielectric materials (202, 200) forms the structure of wall. Above the wall is a chalcogenide material 206 with a metal cap material 208. The metal cap material 208 corresponds to the bitline metal in FIG. 4. The metal cap material 208 and the chalcogenide material 206 together are called storage element. On top of the storage element is a third dielectric material 210, which has a function of hard mask during the definition of the multilayer stack 50.

In one embodiment, the metal heater material 204 is typically made of TiSiN, and the first dielectric material 202 is typically made of SiN. The layer formed by the metal heater material 204 and the first dielectric material 202 is typically 80 nm±10 nm in thickness. The second dielectric material 200 at the bottom of the stack is made of oxide. Further, the chalcogenide material 206 is typically 75±10 nm thick, and the metal cap layer 208 is typically Ti/TiN based with a thickness of 45±10 nm. Additionally, the third dielectric material 210 at the top of the stack 50 is typically SiN or SiON, but is also possible to use an oxide or a composite layer such as SiN and amorphous carbon. The third dielectric material 210 is typically 600±100 nm thick.

Figure 6:
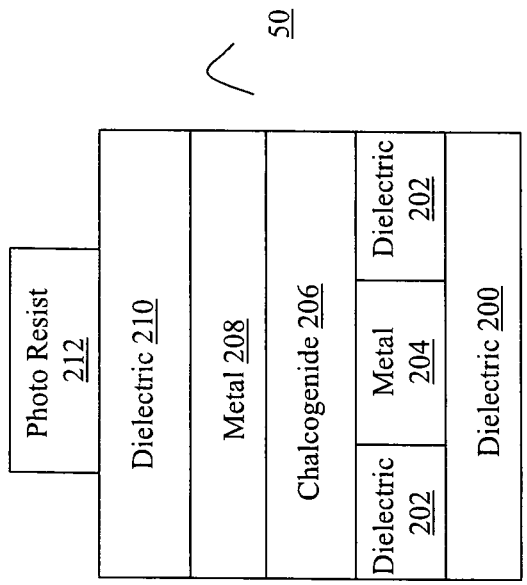
FIG. 6 illustrates a cross-sectional view of the multilayer stack, showing that a photo resist is deposited and patterned on top of the multilayer stack in accordance with one embodiment of the present invention.

Referring to FIG. 6, a layer of photo resist 212 is deposited and patterned on top of the multilayer stack 50 using a standard lithography process. The photo resist forms an etch mask directly over the metal heater material 204. Subsequently as shown in FIG. 7, the dielectric hard mask 210 and the metal cap layer 208 are patterned using the photo resist 212 as the etch mask. In one embodiment, the dielectric hard mask 210 is etched by a $CF_4$ based dry etch chemistry, and the metal cap layer 208 is etched by Cl/Ar dry etch chemistry. In another embodiment, the metal cap layer 208 is not etched or is only partially etched in order to protect the underlying chalcogenide material 206.

According to one embodiment, after the dielectric hard mask 210 and the metal cap layer 208 are defined, the photo resist 212 is removed. In another embodiment, the photo resist 212 may be removed using $O_2/N_2/H_2$ based plasma dry process. The advantage of stripping the photo resist 212 before patterning the chalcogenide material 206 is that the chalcogenide sidewalls will not be exposed to the dry and wet chemicals used in removing the photo resist and polymers when the removal is done after defining the chalcogenide.

Turning to FIG. 8, the chalcogenide material 206 is patterned without the presence of photo resist 212 but with the help of the hard mask dielectric 210. In one embodiment, the chalcogenide etch is performed using a $CF_4$ based dry etch chemistry. Etching or complete etching of the metal cap layer 208 is performed if necessary. In another embodiment, partial etching of the first dielectric 202 and the metal heater material 204 is further performed.

Figures 9, 10:
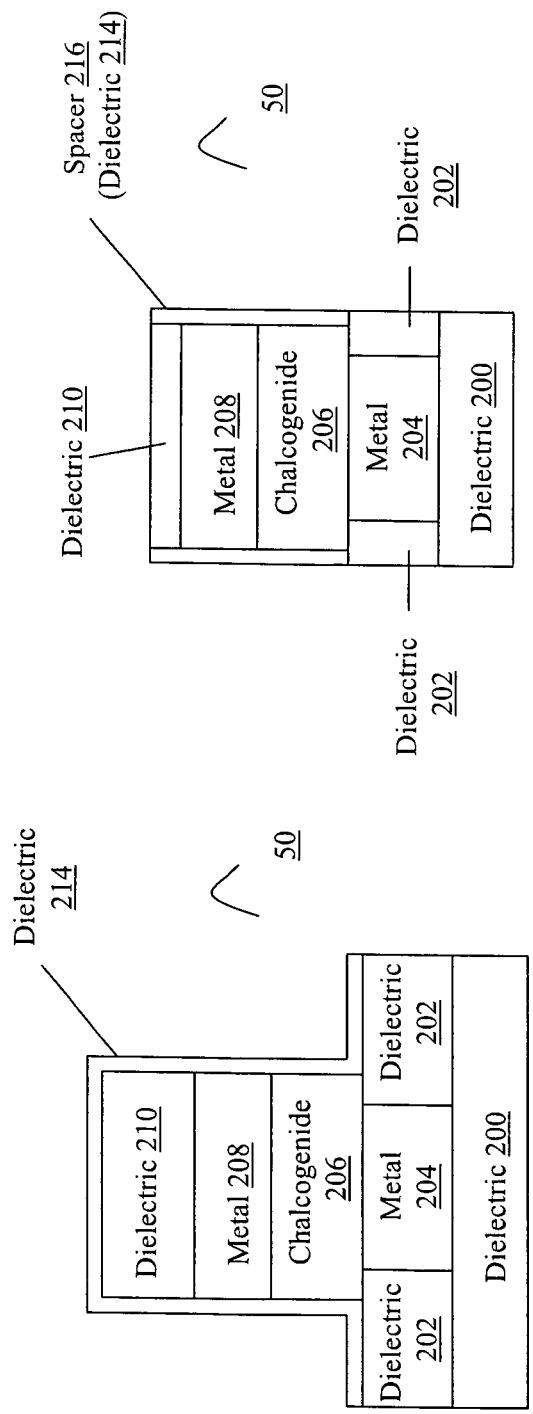
FIG. 9 illustrates a cross-sectional view of the multilayer stack, showing that a dielectric is deposited over the multilayer stack in accordance with one embodiment of the present invention.
FIG. 10 illustrates a cross-sectional view of the multilayer stack, showing the formation of chalcogenide sidewall spacers in accordance with one embodiment of the present invention.

FIG. 9 illustrates the blanket deposition of a spacer dielectric 214 on the multilayer stack 50 after the definition of chalcogenide material 206. The function of the spacer dielectric 214 is to seal the sidewall of the multilayer stack 50 by forming sidewall spacer as discussed below. The sidewall spacer helps to prevent degradation of the chalcogenide material 206 and the metal cap material 208 during subsequent etching and polymers removal. The spacer dielectric 214 is typically made of SiN. The thickness of the spacer dielectric 214 is determined by the desired width for the sidewall spacer. In some embodiments, the spacer dielectric 214 has a thickness range between 200 and 1000 Å, typically 600 Å.

Referring to FIG. 10, an anisotropic etch-back of the spacer dielectric 214 is performed to form dielectric spacers 216 on sidewalls of the chalcogenide material 206 and the metal cap material 208. The etch-back removes the portions of the spacer dielectric 214 on top of the hard mask dielectric 210 and the first dielectric 202, leaving the portions of the spacer dielectric 214 on the sidewalls of the chalcogenide material 206 and the metal cap material 208 to form the dielectric spacers 216. The dielectric spacers 216 protect the chalcogenide from degradation during the multilayer stack etch and the eventual cleanings after etch for removing etch sub-products.

In one embodiment, the etch-back is performed by an $SF_6$ based dry etch chemistry. In another embodiment, the etch-back is continued to pattern the metal heater material 204 in the direction going in and out of the plane of the cross-section. The etch-back also etches the first dielectric 202 and the second dielectric 200, using the hard mask dielectric 210 as the etch mask. In some embodiments, the hard mask dielectric 210 is also partially removed during the dry etch as a result of material consumption.

Figure 11:
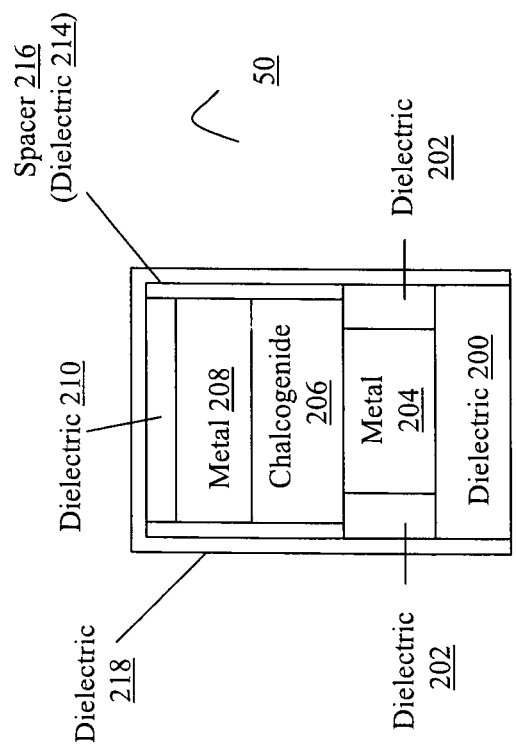
FIG. 11 illustrates a cross-sectional view of the multilayer stack, showing that an enclosure dielectric is deposited over the multilayer stack in accordance with one embodiment of the present invention.

Finally as FIG. 11 illustrates, after the formation of the chalcogenide sidewall spacers 216, an enclosure dielectric 218 is deposited over the multilayer stack 50 in order to seal the entire structure.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method comprising:
 forming a stack comprising
  forming a metal heater layer,
  forming a chalcogenide over the metal heater layer such that a lowermost portion of the chalcogenide is only partially in contact with the metal heater, and
  forming a first dielectric on top of the chalcogenide;
 defining the first dielectric using a photo resist as a mask, defining the first dielectric being followed by removing the photo resist prior to defining the chalcogenide;
 defining the chalcogenide using the defined first dielectric as a mask; and
 sealing sidewalls of the chalcogenide with a second dielectric.

2. The method of claim 1, wherein the stack further comprises forming a metal cap over the chalcogenide, wherein defining the first dielectric further comprises defining the metal cap.

3. The method of claim 2, wherein defining the metal cap uses Cl/Ar dry etch chemistry.

4. The method of claim 2, wherein defining the metal cap partially removes the metal cap.

5. The method of claim 1, wherein the photo resist is removed by $O_2/N_2/H_2$ based plasma dry removal process.

6. The method of claim 1, wherein the chalcogenide is defined by $CF_4$ based dry etch chemistry.

7. The method of claim 1, wherein sealing sidewalls of the chalcogenide with a second dielectric further comprises forming the second dielectric over the stack and anisotropically etching the second dielectric to form sidewall spacers for the chalcogenide.

8. The method of claim 7, wherein etching the second dielectric further comprises:
 forming a surrounding dielectric material on the sides of the metal heater layer;
 etching the metal heater layer beneath the chalcogenide; and
 etching the surrounding dielectric material formed on the sides of the metal heater layer.

9. The method of claim 8, wherein etching the second dielectric uses $SF_6$ based dry etch chemistry.

10. The method of claim 1, further comprises forming an enclosure dielectric over the stack after sealing the sidewalls of the chalcogenide.

11. A method of forming a storage element structure, the method comprising:
 forming a portion of a multilayer stack comprising a metal heater and a dielectric hard mask layer with a chalcogenide layer disposed therebetween, the metal heater being coupled to a portion of a lowermost section of the chalcogenide layer;
 depositing and patterning a photo resist layer on top of the portion of the multilayer stack;
 etching the dielectric hard mask layer with $CF_4$ based dry etch chemistry using the photo resist layer as an etch mask;
 after the dielectric hard mask layer is etched, removing the photo resist layer before etching the chalcogenide layer;
 etching the chalcogenide layer using the dielectric hard mask layer as an etch mask;
 forming a spacer dielectric over at least a portion of the multilayer stack; and
 anisotropically etching the spacer dielectric to form sidewall spacers for the at least the portion of the multilayer stack.

12. A method of forming a storage element structure, the method comprising:
 forming a portion of a multilayer stack comprising a metal heater and a dielectric hard mask layer with a chalcogenide layer disposed therebetween, the metal heater being coupled to a portion of a lowermost section of the chalcogenide layer;
 depositing and patterning a photo resist layer on top of the portion of the multilayer stack;
 etching the dielectric hard mask layer using the photo resist layer as an etch mask;
 after the dielectric hard mask layer is etched, removing the photo resist layer before etching the chalcogenide layer, the photo resist layer being removed by $O_2/N_2/H_2$ based plasma dry removal process;
 etching the chalcogenide layer using the dielectric hard mask layer as an etch mask;
 forming a spacer dielectric over at least a portion of the multilayer stack; and
 anisotropically etching the spacer dielectric to form sidewall spacers for the at least the portion of the multilayer stack.

13. A method of forming a storage element structure, the method comprising:
 forming a portion of a multilayer stack comprising a metal heater and a dielectric hard mask layer with a chalcogenide layer disposed therebetween, the metal heater being coupled to a portion of a lowermost section of the chalcogenide layer;
 depositing and patterning a photo resist layer on top of the portion of the multilayer stack;
 etching the dielectric hard mask layer using the photo resist layer as an etch mask;
 after the dielectric hard mask layer is etched, removing the photo resist layer before etching the chalcogenide layer;
 etching the chalcogenide layer using the dielectric hard mask layer as an etch mask, the chalcogenide layer being etched by $CF_4$ based dry etch chemistry;
 forming a spacer dielectric over at least a portion of the multilayer stack; and
 anisotropically etching the spacer dielectric to form sidewall spacers for the at least the portion of the multilayer stack.

14. A method of forming a storage element structure, the method comprising:
 forming a portion of a multilayer stack comprising a metal heater and a dielectric hard mask layer with a chalcogenide layer disposed therebetween, the metal heater being coupled to a portion of a lowermost section of the chalcogenide layer;
 depositing and patterning a photo resist layer on top of the portion of the multilayer stack;
 etching the dielectric hard mask layer using the photo resist layer as an etch mask;
 after the dielectric hard mask layer is etched, removing the photo resist layer before etching the chalcogenide layer;
 etching the chalcogenide layer using the dielectric hard mask layer as an etch mask;
 forming a spacer dielectric over at least a portion of the multilayer stack; and
 anisotropically etching the spacer dielectric to form sidewall spacers for the at least the portion of the multilayer stack, the spacer dielectric being anisotropically etched by $SF_6$ based dry etch chemistry.

15. A method of forming a storage element structure, the method comprising:
   forming a portion of a multilayer stack comprising a metal heater and a dielectric hard mask layer with a chalcogenide layer disposed therebetween, forming the multilayer stack further comprising forming a surrounding first dielectric material on the sides of the metal heater and forming a second dielectric beneath the metal heater, the metal heater being coupled to a portion of a lowermost section of the chalcogenide layer;
   depositing and patterning a photo resist layer on top of the portion of the multilayer stack;
   etching the dielectric hard mask layer using the photo resist layer as an etch mask;
   after the dielectric hard mask layer is etched, removing the photo resist layer before etching the chalcogenide layer;
   etching the chalcogenide layer using the dielectric hard mask layer as an etch mask;
   forming a spacer dielectric over at least a portion of the multilayer stack; and
   anisotropically etching the spacer dielectric to form sidewall spacers for the at least the portion of the multilayer stack.

16. A method of forming a storage element structure, the method comprising:
   forming a portion of a multilayer stack comprising a refractory ternary metal nitride heater and a dielectric hard mask layer with a chalcogenide layer disposed therebetween, the refractory ternary metal nitride heater comprising TiSiN, about 80 nm thick, coupled to a portion of a lowermost section of the chalcogenide layer;
   depositing and patterning a photo resist layer on top of the portion of the multilayer stack;
   etching the dielectric hard mask layer using the photo resist layer as an etch mask;
   after the dielectric hard mask layer is etched, removing the photo resist layer before etching the chalcogenide layer;
   etching the chalcogenide layer using the dielectric hard mask layer as an etch mask;
   forming a spacer dielectric over at least a portion of the multilayer stack; and
   anisotropically etching the spacer dielectric to form sidewall spacers for the at least the portion of the multilayer stack.

* * * * *

UNITED STATES PATENT AND TRADEMARK OFFICE
CERTIFICATE OF CORRECTION

PATENT NO.        : 8,623,697 B2  
APPLICATION NO.   : 13/132311  
DATED             : January 7, 2014  
INVENTOR(S)       : Magistretti et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 132 days.

Signed and Sealed this

Twenty-second Day of September, 2015

Michelle K. Lee  
*Director of the United States Patent and Trademark Office*